(12) United States Patent
Seo et al.

(10) Patent No.: US 9,917,280 B2
(45) Date of Patent: Mar. 13, 2018

(54) DISPLAY DEVICE

(71) Applicant: SAMSUNG DISPLAY CO., LTD., Yongin-si, Gyeonggi-do (KR)

(72) Inventors: Ilhun Seo, Asan-si (KR); Byoungki Kim, Seoul (KR); Youngjun Shin, Seongnam-si (KR); Jiyoun Lee, Anyang-si (KR); Jaebeom Choi, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/135,775

(22) Filed: Apr. 22, 2016

(65) Prior Publication Data

US 2016/0315288 A1 Oct. 27, 2016

(30) Foreign Application Priority Data

Apr. 24, 2015 (KR) .................. 10-2015-0058214

(51) Int. Cl.
*H01L 51/52* (2006.01)
*H01L 27/32* (2006.01)

(52) U.S. Cl.
CPC ...... *H01L 51/5271* (2013.01); *H01L 27/3246* (2013.01); *H01L 51/5259* (2013.01)

(58) Field of Classification Search
None
See application file for complete search history.

(56) References Cited

U.S. PATENT DOCUMENTS

| | | | |
|---|---|---|---|
| 5,634,709 A * | 6/1997 | Iwama | B60R 1/12 345/7 |
| 6,166,848 A * | 12/2000 | Cammenga | B60Q 1/2665 359/265 |
| 6,577,056 B1 | 6/2003 | Chang | |
| 7,551,354 B2 * | 6/2009 | Horsten | A47G 1/02 359/485.07 |
| 8,099,247 B2 * | 1/2012 | Mischel, Jr. | A47G 1/02 348/744 |
| 2003/0151354 A1 * | 8/2003 | Takizawa | G02F 1/133553 313/498 |
| 2006/0007550 A1 * | 1/2006 | Tonar | B60R 1/088 359/604 |

(Continued)

FOREIGN PATENT DOCUMENTS

KR 20000065280 A 11/2000
KR 1020060067049 A 6/2006
(Continued)

*Primary Examiner* — Michael Lebentritt
*Assistant Examiner* — Jordan Klein
(74) *Attorney, Agent, or Firm* — Cantor Colburn LLP

(57) ABSTRACT

A display device includes a first substrate, a pixel defining layer on the first substrate, the pixel defining layer configured to define a light emission area, a first electrode in the light emission area, a light emitting layer on the first electrode, a second electrode on the light emitting layer, a second substrate which is opposite to the first substrate, and a reflecting member on a lower surface of the first substrate. The reflecting member may include a first reflecting unit on the lower surface of the first substrate, the first reflecting unit having an aperture at a position overlapping the light emission area, and a second reflecting unit on the first reflecting unit.

15 Claims, 7 Drawing Sheets

(56) References Cited

U.S. PATENT DOCUMENTS

| | | | |
|---|---|---|---|
| 2006/0028730 A1* | 2/2006 | Varaprasad | B32B 17/06 359/604 |
| 2006/0125390 A1 | 6/2006 | Oh | |
| 2007/0177112 A1* | 8/2007 | Kato | G03B 21/62 353/98 |
| 2010/0201609 A1* | 8/2010 | Kim | H01L 51/5259 345/76 |
| 2012/0236388 A1* | 9/2012 | De Wind | B60R 1/04 359/267 |
| 2012/0299472 A1* | 11/2012 | Chung | H01L 51/5271 313/504 |
| 2013/0299808 A1* | 11/2013 | Sugimoto | H01L 27/3258 257/40 |
| 2014/0160411 A1* | 6/2014 | Yim | G02F 1/133553 349/113 |
| 2014/0291637 A1* | 10/2014 | Yim | H01L 27/3244 257/40 |
| 2016/0056415 A1* | 2/2016 | Yoo | H01L 51/5284 349/43 |
| 2016/0285048 A1* | 9/2016 | Chung | H01L 51/5271 |

FOREIGN PATENT DOCUMENTS

| | | |
|---|---|---|
| KR | 1020090065104 A | 6/2009 |
| KR | 1020090099744 A | 9/2009 |
| KR | 1020100090448 A | 8/2010 |

\* cited by examiner

DISPLAY DEVICE

This application claims the priority to Korean Patent Application No. 10-2015-0058214, filed on Apr. 24, 2015, and all the benefits accruing therefrom under 35 U.S.C. § 119, the content of which in its entirety is incorporated by reference.

BACKGROUND

1. Field

Exemplary embodiments of the invention relate to a display device having a mirror function.

2. Description of the Related Art

Flat panel display devices, such as a liquid crystal display ("LCD") device and an organic light emitting diode ("OLED") display device, commonly include a plurality of pairs of electrodes which generate an electric field and an electro-optical active layer interposed therebetween. The LCD device includes a liquid crystal layer as the electro-optical active layer, and the OLED display device includes an organic light emitting layer as the electro-optical active layer.

In general, the OLED display device may display colors based on a principle in which a hole and an electron injected from an anode and a cathode, respectively, are combined with each other to emit light. The OLED display device may have a stacked structure in which a light emitting layer is disposed between the anode serving as a pixel electrode and the cathode serving as an opposing electrode.

Recently, the display device is being replaced by a slim-type flat panel display device that is portable, and a scheme of realizing a mirror function, along with a display function, utilizing external light reflection has been suggested.

SUMMARY

Exemplary embodiments of the invention are directed to a display device including a reflecting member which is applicable to a bottom-emission type display device to realize a mirror function.

According to an exemplary embodiment of the invention, a display device includes a first substrate, a pixel defining layer on the first substrate, the pixel defining layer configured to define a light emission area, a first electrode in the light emission area, a light emitting layer on the first electrode, a second electrode on the light emitting layer, a second substrate which is opposite to the first substrate, and a reflecting member on a lower surface of the first substrate. The reflecting member may include a first reflecting unit on the lower surface of the first substrate, the first reflecting unit having an aperture at a position overlapping the light emission area, and a second reflecting unit on the first reflecting unit.

In an exemplary embodiment, a size of the aperture of the first reflecting unit may be less than a size of the light emission area.

In an exemplary embodiment, the size of the aperture of the first reflecting unit may be less than a size of the first electrode.

In an exemplary embodiment, the size of the aperture of the first reflecting unit may be less than a size of the light emitting layer.

In an exemplary embodiment, the first reflecting unit may include at least one of aluminum (Al), chromium (Cr), silver (Ag), iron (Fe), platinum (Pt), mercury (Hg), nickel (Ni), tungsten (W), vanadium (V), and molybdenum (Mo).

In an exemplary embodiment, the second reflecting unit may include a transparent material.

In an exemplary embodiment, the second reflecting unit may be disposed within the aperture of the first reflecting unit.

In an exemplary embodiment, the first reflecting unit may have a thickness greater than a thickness of the second reflecting unit.

In an exemplary embodiment, the display device may further include a filling member on the second reflecting unit.

In an exemplary embodiment, the display device may further include a transparent glass on the filling member.

In an exemplary embodiment, the display device may further include a sealing member between the second reflecting unit and the transparent glass, the sealing member surrounding the filling member.

In an exemplary embodiment, the display device may further include a moisture absorbing member between the filling member and the sealing member.

According to an exemplary embodiment of the invention, a display device includes a first substrate, a pixel defining layer on the first substrate, the pixel defining layer configured to define a light emission area, a first electrode in the light emission area, a light emitting layer on the first electrode, a second electrode on the light emitting layer, a second substrate which is opposite to the first substrate, a filling member on a lower surface of the first substrate, a reflecting member on the filling member, and a transparent glass on the reflecting member. The reflecting member may include a first reflecting unit on the lower surface of the first substrate, the first reflecting unit having an aperture at a position overlapping the light emission area, and a second reflecting unit on the first reflecting unit.

In an exemplary embodiment, a size of the aperture of the first reflecting unit may be less than a size of the light emission area.

In an exemplary embodiment, a size of the aperture of the first reflecting unit may be less than a size of the first electrode.

In an exemplary embodiment, a size of the aperture of the first reflecting unit may be less than a size of the light emitting layer.

In an exemplary embodiment, the second reflecting unit may be disposed within the aperture of the first reflecting unit.

In an exemplary embodiment, the first reflecting unit may have a thickness greater than a thickness of the second reflecting unit.

According to an exemplary embodiment of the invention, a display device includes a first substrate, a pixel defining layer on the first substrate, the pixel defining layer configured to define a light emission area, a first electrode in the light emission area, a light emitting layer on the first electrode, a second electrode on the light emitting layer, a second substrate which is opposite to the first substrate, and a reflecting member on a lower surface of the first substrate. The reflecting member may include a first reflecting unit on the lower surface of the first substrate, the first reflecting unit having a groove at a position overlapping the light emission area.

In an exemplary embodiment, the display device may further include a second reflecting unit on the first reflecting unit.

The foregoing is illustrative only and is not intended to be in any way limiting. In addition to the illustrative exemplary embodiments, and features described above, further exemplary embodiments, and features will become apparent by reference to the drawings and the following detailed description.

BRIEF DESCRIPTION OF THE DRAWINGS

The above and other features and exemplary embodiments of the invention of invention will be more clearly understood from the following detailed description taken in conjunction with the accompanying drawings, in which.

DETAILED DESCRIPTION

Figure 1:
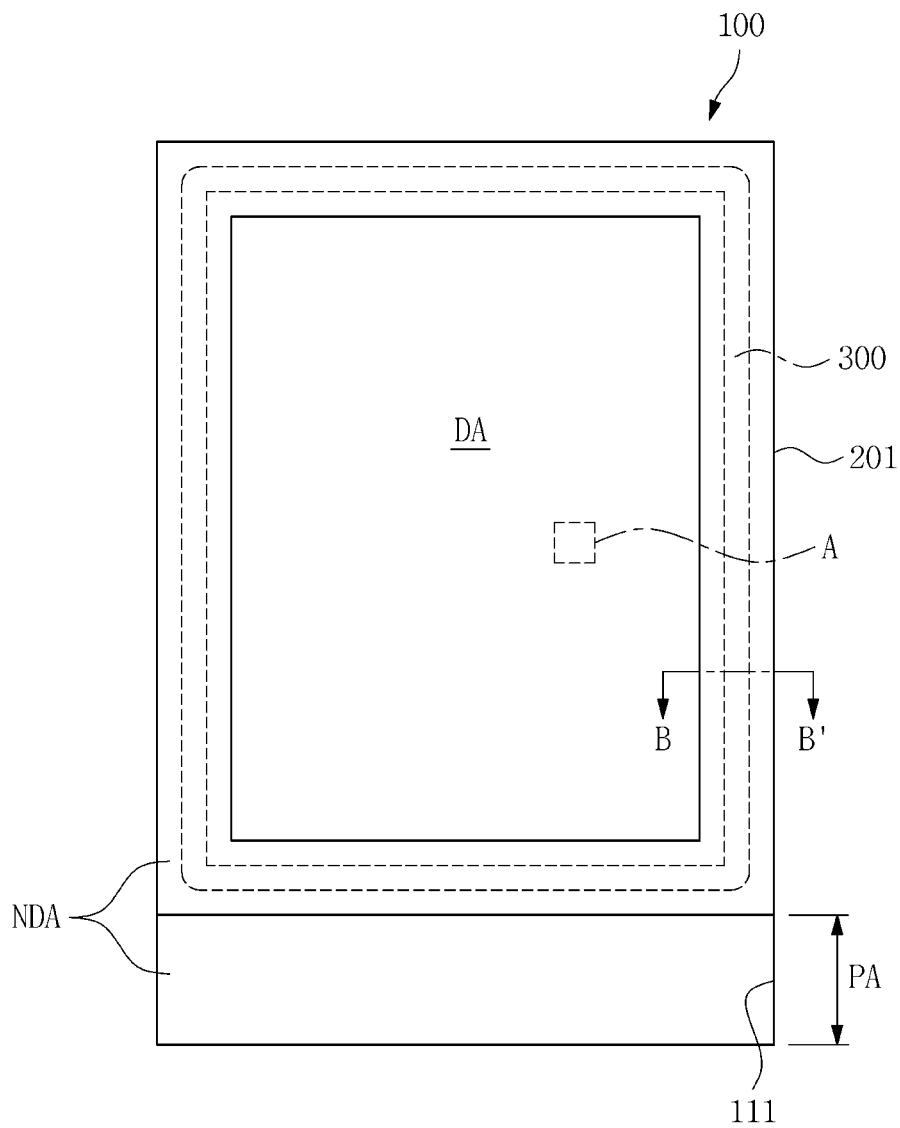
FIG. 1 is a schematic plan view illustrating an exemplary embodiment of a display device according to the invention.

Advantages and features of the invention and methods for achieving them will be made clear from embodiments described below in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the embodiments in order to prevent the invention from being obscurely interpreted. Like reference numerals refer to like elements throughout the specification.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular exemplary embodiments only and is not intended to be limiting. Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display device according to an exemplary embodiment will be described in detail with reference to FIGS. 1, 2, and 3. The display device according to the exemplary embodiment may be an organic light emitting diode ("OLED") display device. Hereinafter, the display device will be described under the assumption that it is an OLED display device.

FIG. 1 is a schematic plan view illustrating a display device according to an exemplary embodiment. FIG. 2 is an enlarged plan view illustrating area A of FIG. 1. FIG. 3 is a cross-sectional view taken along line A-A' of FIG. 2;

In reference to FIG. 1, the OLED display device 100 according to the exemplary embodiment may include a first substrate 111, a second substrate 201, and a sealing member 300. However, the invention is not limited thereto, and it is obvious that the first substrate 111 may be encapsulated by an encapsulation film, rather than by the second substrate 201.

The first substrate 111 may include a display area DA for displaying an image by light emission and a non-display area NDA positioned at an outline of the display area DA. An OLED, and a thin film transistor ("TFT") and a wiring for driving the OLED may be provided in the display area DA. The non-display area NDA may include a pad area PA on which a plurality of pad electrodes (not illustrated) receives an external signal, which allows the OLED to perform light emission, and supply the signal to the OLED.

The OLED display device 100 according to the exemplary embodiment will be described under the assumption that it is a bottom-emission type, for example. However, the invention is not limited thereto, and the OLED display device 100 may be various other types of the OLED display device.

The display area DA according to the illustrated exemplary embodiment will be described hereinafter with reference to FIGS. 2 and 3.

Figure 2:
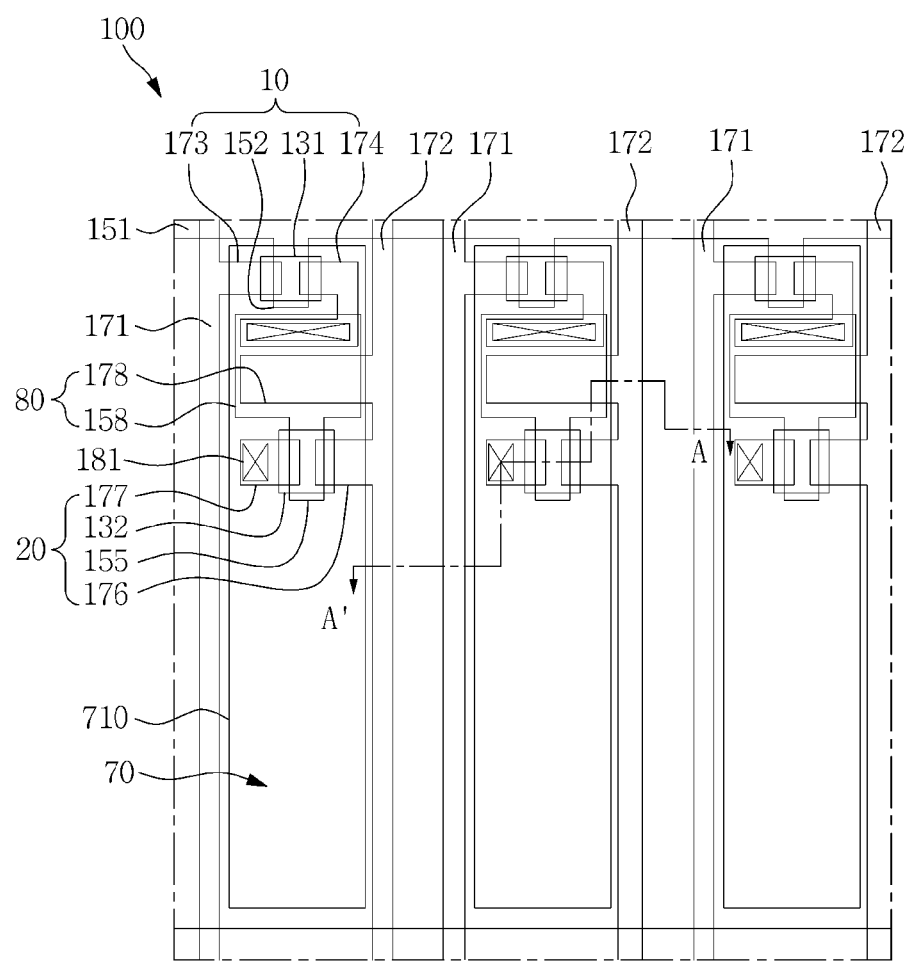
FIG. 2 is an enlarged plan view illustrating area A of FIG. 1.
Figure 3:
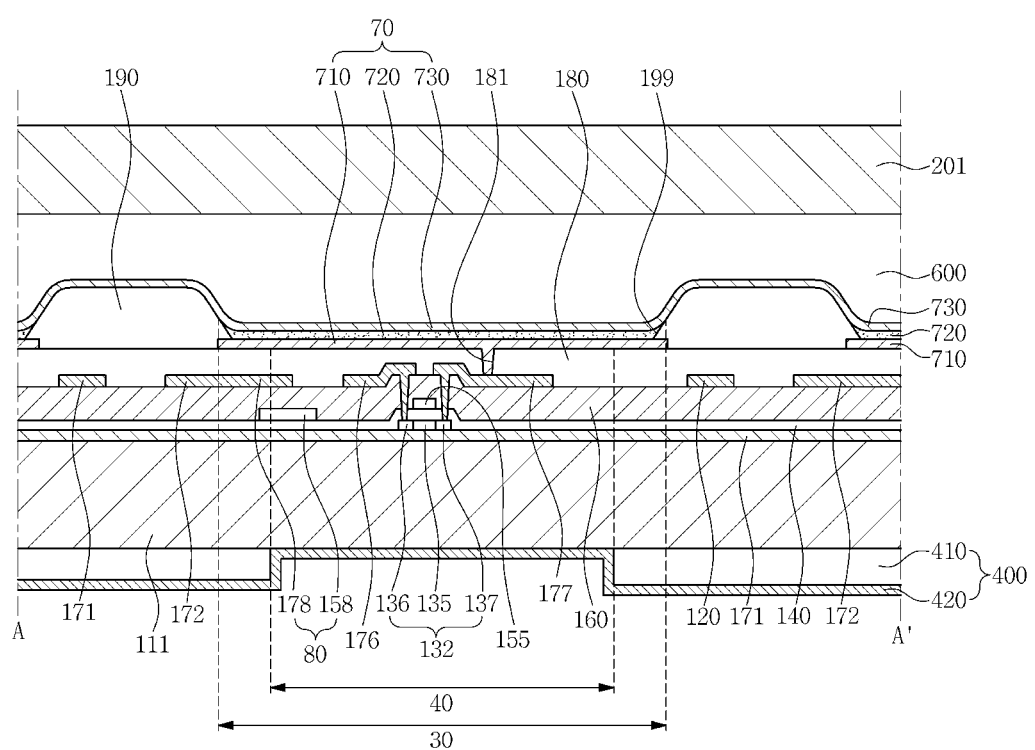
FIG. 3 is a cross-sectional view taken along line A-A' of FIG. 2.

FIGS. 2 and 3 illustrate an active-matrix type organic light emitting diode ("AMOLED") device having a 2Tr-1Cap structure. The 2Tr-1Cap structure includes two thin film transistors ("TFT") 10 and 20 and a capacitor 80 in each pixel, for example. However, the invention and the exemplary embodiment are not limited thereto.

In an exemplary embodiment, for example, the OLED display device 100 may include three or more TFTs and two or more capacitors in a pixel, and may further include additional wirings to have various configurations. Herein, the term "pixel" refers to a smallest unit for displaying an image, and the display area displays an image using a plurality of pixels.

The OLED display device 100 according to the exemplary embodiment may include the first substrate 111 and a plurality of pixels defined on the first substrate 111. Each pixel may include the switching TFT 10, the driving TFT 20, the capacitor 80, the OLED 70, and a reflecting member 400 on a lower surface of the first substrate 111. Further, the first substrate 111 may further include a gate line 151 disposed along a direction, and a data line 171 and a common power line 172 insulated from and intersecting the gate line 151.

Herein, each pixel may be defined by the gate line 151, the data line 171, and the common power line 172, but is not limited thereto.

The OLED 70 may include a first electrode 710, an organic light emitting layer 720 on the first electrode 710, and a second electrode 730 on the organic light emitting layer 720. Herein, at least one first electrode 710 may be disposed on each pixel, such that the first substrate 111 may include a plurality of first electrodes 710 spaced apart from each other.

In an exemplary embodiment, the first electrode 710 may be a positive end (anode) serving as a hole injection electrode, and the second electrode 730 may be a negative end (cathode) serving as an electron injection electrode. However, the invention is not limited thereto. In another exemplary embodiment, the first electrode 710 may be a cathode and the second electrode 730 may be an anode, based on a driving scheme of the OLED display device 100, for example. In another exemplary embodiment, the first electrode 710 may be a pixel electrode, and the second electrode 730 may be a common electrode.

The holes and electrons injected to the organic light emitting layer 720 are combined with each other to form an exciton, and then light is emitted when the exciton falls from an excited state to a ground state.

The capacitor 80 may include a pair of storage electrodes 158 and 178 with an insulating layer 160 interposed therebetween. Herein, the insulating layer 160 may include a dielectric material. The capacitance of the capacitor 80 is determined by electric charges accumulated in the capacitor 80 and a voltage across the pair of storage electrodes 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177.

The switching TFT 10 may function as a switching element which selects a pixel to perform light emission. The switching gate electrode 152 is connected to the gate line 151, and the switching source electrode 173 is connected to the data line 171. The switching drain electrode 174 is spaced apart from the switching source electrode 173 and connected to the first storage electrode 158.

The driving TFT 20 may apply a driving power to the first electrode 710, which allows the organic light emitting layer 720 of the OLED 70 in a selected pixel to emit light. The driving gate electrode 155 is connected to the first storage electrode 158 which is connected to the switching drain electrode 174. The driving source electrode 176 and the second storage electrode 178 are connected to the common power line 172.

The driving drain electrode 177 is connected to the first electrode 710 of the OLED 70 through a drain contact hole 181.

With the above-described configuration, the switching TFT 10 may be operated by a gate voltage applied to the gate line 151 and may function to transmit a data voltage applied to the data line 171 to the driving TFT 20.

Voltage equivalent to a difference between a common voltage applied from the common power line 172 to the driving TFT 20 and the data voltage transmitted from the switching TFT 10 may be stored in the capacitor 80, and current corresponding to the voltage stored in the capacitor 80 may flow to the OLED 70 through the driving TFT 20, so that the OLED 70 may emit light.

The configuration of the OLED display device 100 according to the exemplary embodiment will be described further with reference to FIG. 2 along with FIG. 3.

The OLED 70, the driving TFT 20, the capacitor 80, the data line 171, and the common power line 172 illustrated in FIG. 3 will be mainly described. Further, the switching semiconductor layer 131, the switching gate electrode 152, the switching source and drain electrodes 173 and 174 of the switching TFT 10 may have the same stacked structure as that of the driving semiconductor layer 132, the driving gate electrode 155, the driving source and drain electrodes 176 and 177 of the driving TFT 20, and thus the repeated description may be omitted.

According to the illustrated exemplary embodiment, the first substrate 111 may include an insulating first substrate including glass, quartz, ceramic, plastic or the like, for example. However, the invention is not limited thereto, and the first substrate 111 may include a metal first substrate including stainless steel or the like, for example.

A buffer layer 120 may be disposed on the first substrate 111. The buffer layer 120 may efficiently reduce infiltration of undesirable elements and may planarize a surface, and may include various materials in accordance therewith. In an exemplary embodiment, the buffer layer 120 may include at least one of silicon nitride ($SiN_x$), silicon oxide ($SiO_2$), and silicon oxynitride ($SiO_xN_y$), for example. However, the buffer layer 120 may not be always necessary, and may be omitted based on the kind of the first substrate 111 and process conditions thereof.

The driving semiconductor layer 132 may be disposed on the buffer layer 120. The driving semiconductor layer 132 may include at least one semiconductor material selected from a group of polycrystalline silicon, amorphous silicon, and oxide semiconductors. Further, the driving semiconductor layer 132 includes a channel region 135 that is not doped with impurities and p+ doped source and drain regions 136 and 137 that are disposed on both sides of the channel region 135. In this case, p-type impurities, such as boron B, may be used as dopant ions, and $B_2H_6$ may be commonly used. In this regard, such impurities may vary depending on the kinds of the TFT.

In an exemplary embodiment, a gate insulating layer 140 including silicon nitride ($SiN_x$) or silicon oxide ($SiO_2$) may be disposed on the driving semiconductor layer 132, for example. In an exemplary embodiment, the gate insulating layer 140 may include at least one of tetra ethyl ortho silicate ("TEOS"), silicon nitride ($SiN_x$), and silicon oxide ($SiO_2$), for example. In an exemplary embodiment, the gate insulating layer 140 may have a double-layer structure where a silicon nitride ($SiN_x$) layer having a thickness of about 40 nanometers (nm) and a TEOS layer having a thickness of about 80 nm are sequentially stacked, for example. However, the gate insulating layer 140 according to the exemplary embodiment is not limited to the aforementioned configuration.

The driving gate electrode 155, the gate line 151 (refer to FIG. 2), and the first storage electrode 158 may be disposed on the gate insulating layer 140. In this case, the driving gate electrode 155 may overlap at least a portion of the driving semiconductor layer 132. In an exemplary embodiment, the driving gate electrode 155 may overlap the channel region 135. The driving gate electrode 155 may serve to prevent the channel region 135 from being doped with impurities when the source and drain regions 136 and 137 of the driving semiconductor layer 132 are doped with the impurities in the forming of the driving semiconductor layer 132.

The gate electrode 155 and the first storage electrode 158 may be disposed on the same layer, and may include substantially the same metal material. In this case, the metal material may include at least one of molybdenum (Mo), chromium (Cr), and tungsten (W), for example. In an exemplary embodiment, the gate electrode 155 and the first storage electrode 158 may include molybdenum (Mo) or molybdenum (Mo) alloys, for example.

The insulating layer 160 may be disposed on the gate insulating layer 140 to cover the driving gate electrode 155. The insulating layer 160 may be an interlayer insulating layer. In an exemplary embodiment, the insulating layer 160 may include silicon nitride ($SiN_x$) or silicon oxide ($SiO_2$), for example, which is substantially similar to the gate insulating layer 140. A contact hole may be defined in the gate insulating layer 140 and the insulating layer 160 to expose the source and drain regions 136 and 137 of the driving semiconductor layer 132.

In the display area DA, the driving source and drain electrodes 176 and 177, the data line 171, the common power line 172, the second storage electrode 178 may be disposed on the insulating layer 160. The driving source and drain electrodes 176 and 177 are respectively connected to the source and drain regions 136 and 137 of the driving semiconductor layer 132 through the contact hole.

In an exemplary embodiment, the driving source and drain electrodes 176 and 177, the data line 171, the common power line 172, and the second storage electrode 178 may include refractory metal including at least one of molybdenum, chromium, tantalum, titanium and metal alloys thereof and may have a multi-layer structure including a refractory metal film and a low-resistance conductive film, for example. In an exemplary embodiment, the multi-layer structure may include a double-layer structure including a chromium or molybdenum (alloy) lower film and an aluminum (alloy) upper film or a triple-layer structure including a molybdenum (alloy) lower film, an aluminum (alloy) middle film, and a molybdenum (alloy) upper film, for example.

The driving source and drain electrodes 176 and 177, the data line 171, the common power line 172, and the second storage electrode 178 may include various conductive materials other than the aforementioned materials.

Accordingly, the driving TFT 20 may include the driving semiconductor layer 132, the driving gate electrode 155, and the driving source and drain electrodes 176 and 177. However, the configuration of the driving TFT 20 is not limited thereto, and is susceptible to various modifications.

A passivation layer 180 may be disposed on the insulating layer 160 to cover the driving source and drain electrodes 176 and 177, and the like. In an exemplary embodiment, the passivation layer 180 may include an organic material, such as polyacrylate and polyimide. The passivation layer 180 may be a planarization layer.

In an exemplary embodiment, the passivation layer 180 may include at least one of polyacrylate resins, epoxy resins, phenolic resins, polyamide resins, polyimide resins, unsaturated polyester resins, poly-phenylenether resins, poly-phenylenesulfide resins, and benzocyclobutene ("BCB"), for example.

The drain contact hole 181 may be defined in the passivation layer 180 to expose the driving drain electrode 177.

The first electrode 710 may be disposed on the passivation layer 180, and connected to the driving drain electrode 177 through the drain contact hole 181 of the passivation layer 180.

A pixel defining layer 190 may be disposed on the passivation layer 180 to cover the first electrode 710. An aperture 199 may be defined in the pixel defining layer 190 to expose the first electrode 710. In an exemplary embodiment, the first electrode 710 may correspond to the aperture 199 of the pixel defining layer 190.

In addition, the pixel defining layer 190 may define a light emission area 30 on the first substrate 111. The light emission area 30 refers to an area in which a light emitting element directly generates visible light to realize an image which is to be perceived by a user. Accordingly, the light emitting layer 720 may be disposed in the light emission area 30.

In an exemplary embodiment, the pixel defining layer 190 may include resins, such as polyacrylate resins and polyimide resins.

In an exemplary embodiment, the pixel defining layer 190 may include a photosensitive organic material or a photosensitive polymer material, for example. In an exemplary embodiment, the pixel defining layer 190 may include at least one of polyacrylate, polyimide, photo sensitive polyimide ("PSPI"), photosensitive acryl ("PA"), and photosensitive novolak resins, for example.

The organic light emitting layer 720 may be disposed on the first electrode 710 within the aperture 199 of the pixel defining layer 190, and the second electrode 730 may be disposed on the pixel defining layer 190 and the organic light emitting layer 720.

Accordingly, the OLED 70 may include the first electrode 710, the organic light emitting layer 720, and the second electrode 730.

One of the first and second electrodes 710 and 730 may include a transparent conductive material and the other thereof may include a transflective or reflective conductive material. Depending on the material forming the first and second electrodes 710 and 730, the OLED display device 100 may become a top-emission type, a bottom-emission type, or a both-side-emission type.

In an exemplary embodiment, since the OLED display device 100 according to the exemplary embodiment is provided in the bottom-emission type, the second electrode 730 may include the transflective or reflective conductive material, and the first electrode 710 may include the transparent conductive material, for example.

In an exemplary embodiment, the transparent conductive material may include at least one of indium tin oxide ("ITO"), indium zinc oxide ("IZO"), zinc oxide (ZnO), and indium oxide ($In_2O_3$), for example. In an exemplary embodiment, the reflective material may include at least one of lithium (Li), calcium (Ca), lithium fluoride/calcium (LiF/Ca), lithium fluoride/aluminum (LiF/Al), aluminum (Al), silver (Ag), magnesium (Mg), and gold (Au), for example.

The organic light emitting layer 720 may include a low molecular weight organic material or a high molecular weight organic material. The organic light emitting layer 720 may have a multi-layer structure including a primary light emitting layer and at least one of a hole injection layer ("HIL"), a hole transporting layer ("HTL"), an electron transporting layer ("ETL") and an electron injection layer ("EIL"). In an exemplary embodiment, the HIL may be disposed on the first electrode 710, which is a positive end, and the HTL, the primary light emitting layer, ETL, and EIL may be sequentially stacked thereon.

According to the exemplary embodiment, the organic light emitting layer 720 is only provided within the aperture 199 of the pixel defining layer 190, but the invention is not limited thereto. In an exemplary embodiment, at least one layer of the organic light emitting layer 720 may be disposed not only on the first electrode 710 but also between the pixel defining layer 190 and the second electrode 730, within the aperture 199 of the pixel defining layer 190. In an exemplary embodiment, HIL, HTL, ETL, EIL, and the like of the organic light emitting layer 720 may be provided, using an open mask, in an area other than the aperture 199 of the pixel defining layer 190, and the primary light emitting layer of the organic light emitting layer 720 may be provided in each aperture 199 using a fine metal mask ("FMM").

The reflecting member 400 may be disposed on the lower surface of the first substrate 111. The reflecting member 400 may have a suitable reflectivity. The reflecting member 400, in particular, may have a reflectivity that is the same as or similar to a reflectivity of the light emission area 30. It may be desirable that a difference between the reflectivity of the reflecting member 400 and an average reflectivity of the light emission area 30 be less than about 10%, for example. Accordingly, the OLED display device 100 according to the exemplary embodiment may realize an image display function along with a mirror function. The reflecting member 400 may have a suitable thickness according to the reflectivity.

The reflecting member 400 may include a first reflecting unit 410 and a second reflecting unit 420.

The first reflecting unit 410 may be disposed on the lower surface of the first substrate 111 and may have an aperture 40 at a position overlapping the light emission area 30. The first reflecting unit 410 may be disposed in a non-light emission area so as to serve an external-light reflection function and also transmit light emitted from the light emitting layer 720 through the aperture 40 defined in the light emission area 30. Accordingly, as the first reflecting unit 410 is provided, the OLED display device 100 may have a mirror function.

The size of the aperture 40 of the first reflecting unit 410 may be determined in consideration of process efficiency, light leakage, and an aperture ratio. That is, as the size of the aperture 40 is similar to the size of the light emission area 30, light leakage in the vicinity of the light emission area 30 may be prevented and process efficiency may be enhanced, but the aperture ratio may decrease. Accordingly, in consideration of the aperture ratio and the mirror function, the size of the aperture 40 may be differently designed with respect to each display device. However, the size of the aperture 40 of the first reflecting unit 410 is designed to be at least less than the size of the light emission area 30. Further, the size of the aperture 40 may be less than the size of the first electrode 710 and the size of the light emitting layer 720.

In an exemplary embodiment, the first reflecting unit 410 may include at least one of aluminum (Al), chromium (Cr), silver (Ag), iron (Fe), platinum (Pt), mercury (Hg), nickel (Ni), tungsten (W), vanadium (V), and molybdenum (Mo), for example.

The second reflecting unit 420 may be disposed on the first reflecting unit 410. The second reflecting unit 420 may include a transparent material. The second reflecting unit 420 may also be disposed within the aperture 40. Accordingly, the second reflecting unit 420 may include a transparent material so as to transmit light emitted from the light emitting layer 720 of the bottom-emission-type display device. In an exemplary embodiment, the second reflecting unit 420 may include ITO, for example.

The first reflecting unit 410 may have a thickness greater than a thickness of the second reflecting unit 420 so as to improve reflection efficiency.

Accordingly, as the reflecting member 400 is disposed on the lower surface of the first substrate 111, a display device having a mirror function may be realized. In other words, the first reflecting unit 410 and the second reflecting unit 420 may reflect external light so as to allow the display device to be utilized as a mirror. In an exemplary embodiment, the light emission area 30 exposed through the aperture 40 may exhibit a reflectivity of about 60%, for example, when the display device is not in use, and thus may be sufficient to be used as a mirror surface.

In a case where the reflecting member 400 is disposed on the first substrate 111, a composition such as silver (Ag) forming the reflecting member 400 may be damaged in a high-temperature heat treatment process, which is performed to form an inner configuration of the display device. However, the reflecting member 400 according to the invention is disposed on the lower surface of the first substrate 111, after the process for forming the first substrate 111 is completed, and thus may not be damaged by the high-temperature heat treatment process or the like.

The second substrate 201 may be sealingly attached to the first substrate 111 with the OLED 70 interposed therebetween. The second substrate 201 may cover and protect the TFTs 10 and 20 and the OLED 70 disposed on the first substrate 111 to be sealed from the outside. In an exemplary embodiment, the second substrate 201 may be an insulating substrate including glass or plastic.

A buffer member 600 may be disposed between the first substrate 111 and the second substrate 201. The buffer member 600 may protect inner components, such as the OLED 70, from impacts which may be applied from the outside of the OLED display device 100. The buffer member 600 may enhance device reliability of the OLED display device 100. In an exemplary embodiment, the buffer member 600 may include at least one of an organic sealant, such as a urethane-based resin, an epoxy-based resin, and an acrylic resin, and an inorganic sealing member, such as silicon. In an exemplary embodiment, the urethane-based resin may include, for example, urethane acrylate. In an exemplary embodiment, the acrylic resin may include, for example, butyl acrylate and ethylhexylacrylate.

Hereinafter, an OLED display device according to an exemplary embodiment will be described with reference to FIG. 4. The repeated descriptions pertaining to configurations the same as those of the exemplary embodiment will be omitted.

Figure 4:
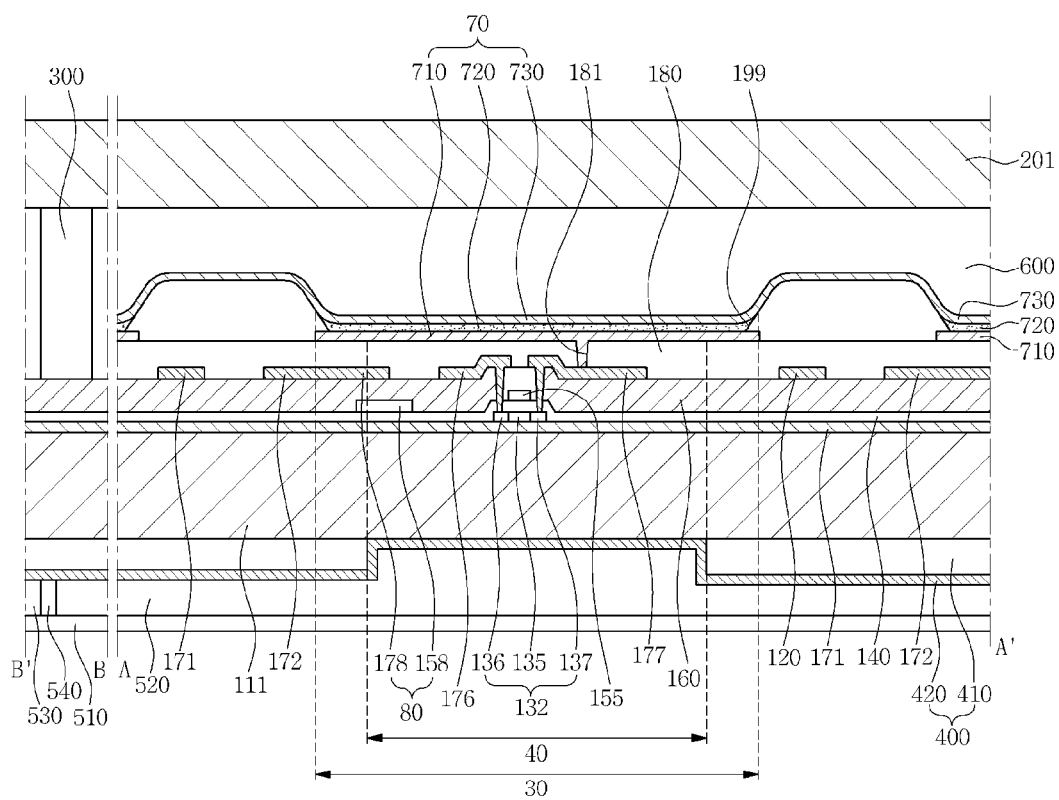
FIG. 4 is a cross-sectional view taken along line B-B' of FIG. 1 and line A-A' of FIG. 2 according to the invention.

FIG. 4 is a cross-sectional view taken along line B-B' of FIG. 1 and line A-A' of FIG. 2 according to the exemplary embodiment.

In reference to FIG. 4, the OLED display device according to the exemplary embodiment may include a filling member 520, a transparent glass 510, a sealing member 530, and a moisture absorbing member 540.

The filling member 520 may be disposed on a second reflecting unit 420, and may absorb external shocks. The sealing member 530 may be disposed between the second reflecting unit 420 and the transparent glass 510, and may surround the filling member 520. The moisture absorbing member 540 may be disposed between the filling member 520 and the sealing member 530. The sealing member 530 and the moisture absorbing member 540 may prevent deformation, caused by infiltration of external oxygen, moisture, and the like, in the reflecting member 400. The transparent glass 510 may be disposed on the filling member 520, and may protect the reflecting member 400 and the filling member 520.

Hereinafter, an OLED display device according to an exemplary embodiment will be described with reference to FIG. 5. The repeated descriptions pertaining to configurations the same as those of the exemplary embodiment will be omitted.

Figure 5:
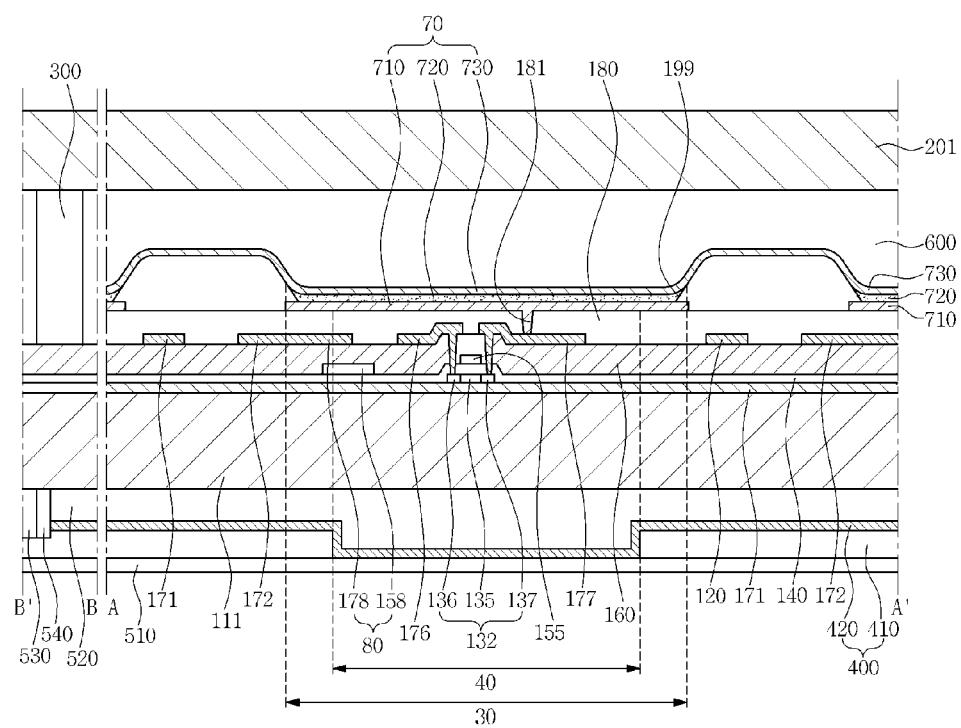
FIG. 5 is a cross-sectional view taken along line B-B' of FIG. 1 and line A-A' of FIG. 2 according to the invention.

FIG. 5 is a cross-sectional view taken along line B-B' of FIG. 1 and line A-A' of FIG. 2 according to the exemplary embodiment.

In reference to FIG. 5, the OLED display device according to the exemplary embodiment may include a filling member 520, a transparent glass 510, a sealing member 530, and a moisture absorbing member 540.

The filling member 520 may be disposed on a lower surface of a first substrate 111, and a reflecting member 400 may be disposed on the filling member 520. The transparent glass 510 may be disposed on the reflecting member 400. The sealing member 530 may surround the filling member 520 and a second reflecting unit 420 to protect. A moisture absorbing member 540 may be disposed between the filling member 520 and the sealing member 530 to prevent moisture infiltration.

Hereinafter, an OLED display device according to an exemplary embodiment will be described with reference to FIGS. 6 and 7. The repeated descriptions pertaining to configurations the same as those of the exemplary embodiment will be omitted.

Figure 6:
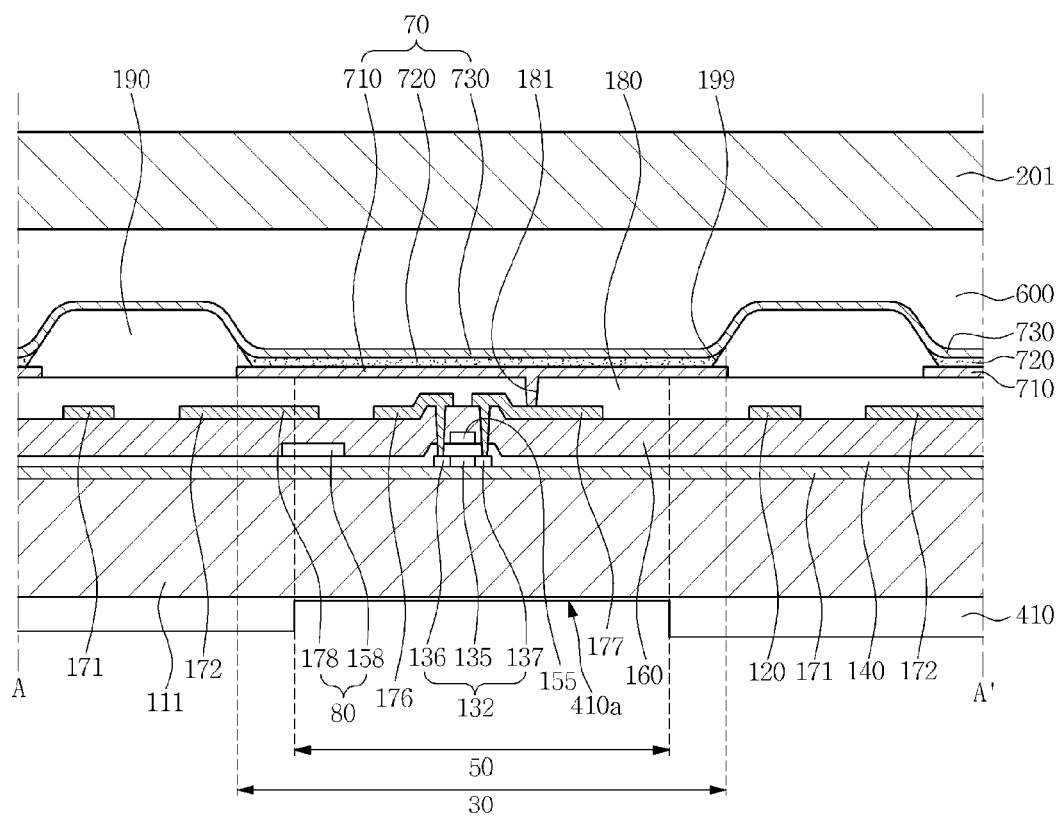
FIGS. 6 and 7 are cross-sectional views taken along line B-B' of FIG. 1 and line A-A' of FIG. 2 according to the invention.
Figure 7:
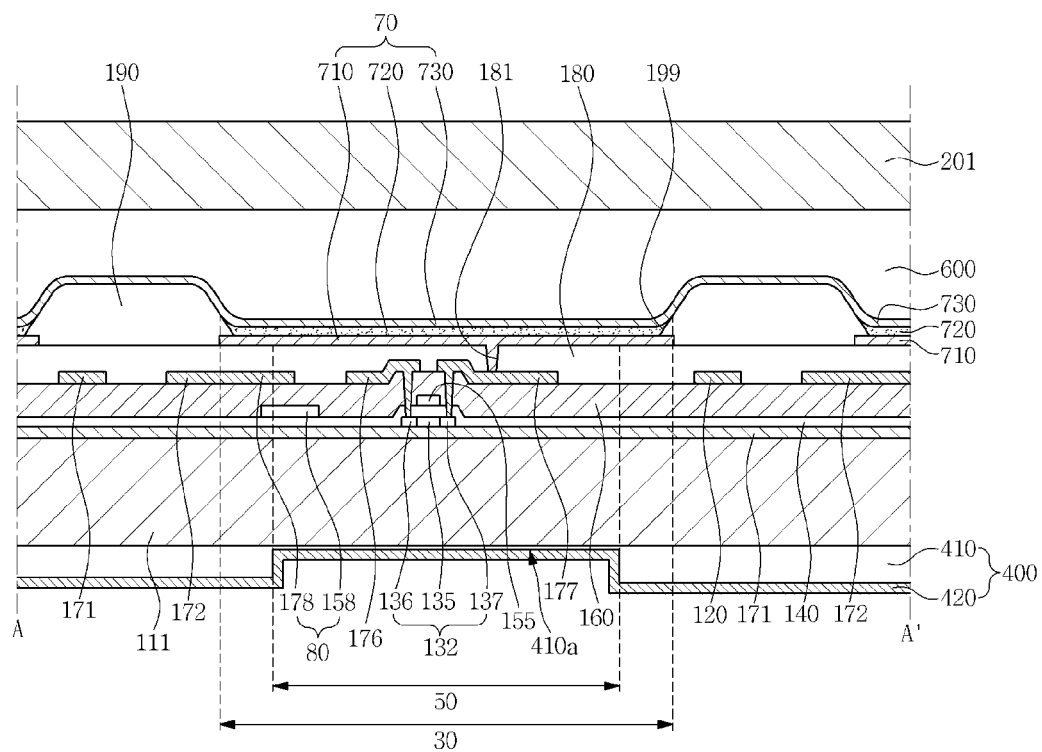

FIGS. 6 and 7 are cross-sectional views taken along line B-B' of FIG. 1 and line A-A' of FIG. 2 according to the exemplary embodiment.

In reference to FIG. 6, a first reflecting unit 410 according to the exemplary embodiment may be disposed on a lower surface of a first substrate 111, a groove 410a may be defined in the first reflecting unit 410 at a position overlapping a light emission area 30. The groove 410a may be defined in a mirror area 50, and the mirror area 50 may have a size less than the size of the light emission area 30. The mirror area 50 corresponds to an area of the aperture 40 (refer to FIG. 3) described hereinabove with reference to FIG. 3. The first reflecting unit 410 may have a small thickness in the mirror area 50, so as to prevent a decrease in light transmittance.

Referring to FIG. 7, a second reflecting unit 420 may be disposed on the first reflecting unit 410.

As set forth above, in the display device according to embodiments of the invention, a mirror function may be realized utilizing external light reflection, damage inflicted to a reflecting member in the manufacturing process of the display device may be prevented, and deformation of the reflecting member, caused by moisture infiltration, may also be prevented.

From the foregoing, it will be appreciated that various embodiments in accordance with the disclosure have been described herein for purposes of illustration, and that various modifications may be made without departing from the scope and spirit of the teachings. Accordingly, the various embodiments disclosed herein are not intended to be limiting of the true scope and spirit of the teachings. Various features of the above described and other embodiments can be mixed and matched in any manner, to produce further embodiments consistent with the invention.

What is claimed is:
1. A display device comprising:
a first substrate;
a pixel defining layer on the first substrate, the pixel defining layer configured to define a light emission area;
a first electrode in the light emission area;
a light emitting layer on the first electrode;
a second electrode on the light emitting layer;
a second substrate which is opposite to the first substrate;
a reflecting member on a lower surface of the first substrate, the reflecting member comprising:
a first reflecting unit on the lower surface of the first substrate, the first reflecting unit having an aperture at a position overlapping the light emission area; and
a second reflecting unit disposed on the first reflecting unit and overlapping the first reflecting unit in a plan view;
a filling member on the second reflecting unit;
a transparent glass on the filling member; and
a sealing member between the second reflecting unit and the transparent glass, the sealing member surrounding the filling member.
2. The display device of claim 1, wherein a size of the aperture of the first reflecting unit is less than a size of the light emission area.
3. The display device of claim 2, wherein the size of the aperture of the first reflecting unit is less than a size of the first electrode.

4. The display device of claim 2, wherein the size of the aperture of the first reflecting unit is less than a size of the light emitting layer.

5. The display device of claim 2, wherein the first reflecting unit comprises at least one of aluminum (Al), chromium (Cr), silver (Ag), iron (Fe), platinum (Pt), mercury (Hg), nickel (Ni), tungsten (W), vanadium (V), and molybdenum (Mo).

6. The display device of claim 5, wherein the second reflecting unit comprises a transparent material.

7. The display device of claim 1, wherein the second reflecting unit is disposed within the aperture of the first reflecting unit.

8. The display device of claim 1, wherein the first reflecting unit has a thickness greater than a thickness of the second reflecting unit.

9. The display device of claim 1, further comprising a moisture absorbing member between the filling member and the sealing member.

10. A display device comprising:
    a first substrate;
    a pixel defining layer on the first substrate, the pixel defining layer configured to define a light emission area;
    a first electrode in the light emission area;
    a light emitting layer on the first electrode;
    a second electrode on the light emitting layer;
    a second substrate which is opposite to the first substrate;
    a filling member on a lower surface of the first substrate;
    a reflecting member on the filling member;
    a transparent glass on the reflecting member; and
    a sealing member between the first substrate and the transparent glass,
    the reflecting member comprising:
        a first reflecting unit on the transparent glass, the first reflecting unit having an aperture at a position overlapping the light emission area; and
        a second reflecting unit disposed on the first reflecting unit and overlapping the first reflecting unit in a plan view, and
    the sealing member surrounding the second reflecting unit and the filling member.

11. The display device of claim 10, wherein a size of the aperture of the first reflecting unit is less than a size of the light emission area.

12. The display device of claim 11, wherein the size of the aperture of the first reflecting unit is less than a size of the first electrode.

13. The display device of claim 11, wherein the size of the aperture of the first reflecting unit is less than a size of the light emitting layer.

14. The display device of claim 10, wherein the second reflecting unit is disposed within the aperture of the first reflecting unit.

15. The display device of claim 10, wherein the first reflecting unit has a thickness greater than a thickness of the second reflecting unit.

* * * * *